United States Patent
Saadat et al.

(10) Patent No.: US 9,276,562 B2
(45) Date of Patent: Mar. 1, 2016

(54) CHARGE-RECYCLING CIRCUITS INCLUDING SWITCHING POWER STAGES WITH FLOATING RAILS

(71) Applicant: QUALCOMM Incorporated, San Diego, CA (US)

(72) Inventors: Seyed Mahmoudreza Saadat, La Jolla, CA (US); Chunlei Shi, San Diego, CA (US); Chenchang Zhan, San Diego, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 0 days.

(21) Appl. No.: 14/260,733

(22) Filed: Apr. 24, 2014

(65) Prior Publication Data

US 2015/0311884 A1    Oct. 29, 2015

(51) Int. Cl.
| | |
|---|---|
| H03K 3/00 | (2006.01) |
| H03K 3/012 | (2006.01) |
| H03K 17/56 | (2006.01) |
| H03K 17/687 | (2006.01) |

(52) U.S. Cl.
CPC ............. *H03K 3/012* (2013.01); *H03K 17/56* (2013.01); *H03K 17/6874* (2013.01); *H03K 2217/0036* (2013.01); *H03K 2217/0081* (2013.01)

(58) Field of Classification Search
USPC .......... 327/108–10, 112, 387–389, 391, 419, 327/427, 434; 323/282–283
See application file for complete search history.

(56) References Cited

U.S. PATENT DOCUMENTS

| | | | |
|---|---|---|---|
| 5,483,486 | A | 1/1996 | Javanifard et al. |
| 6,285,173 | B1 * | 9/2001 | Bentolila et al. ............. 323/282 |
| 7,394,298 | B2 | 7/2008 | Hazucha et al. |
| 7,427,888 | B2 | 9/2008 | Zhang et al. |
| 8,115,461 | B2 | 2/2012 | Yoshio |

(Continued)

FOREIGN PATENT DOCUMENTS

WO         9835433  A1    8/1998

OTHER PUBLICATIONS

Alimadadi M., et al., "A Fully Integrated 660 MHz Low-Swing Energy-Recycling DC-DC Converter," IEEE Transactions on Power Electronics, Jun. 2009, vol. 24 (6), pp. 1475-1485.

(Continued)

*Primary Examiner* — An Luu
(74) *Attorney, Agent, or Firm* — Fountainhead Law Group P.C.

(57) ABSTRACT

In one embodiment, a circuit comprises a first switching transistor and a second switching transistor. The first switching transistor and the second switching transistor are coupled in series between an input voltage and ground and having a common node therebetween to provide a switching output. A first switching circuit selective couples a gate of the first switching transistor to the input voltage and a first mid-level voltage supply. A second switching circuit selectively couples a gate of the second switching transistor to a second mid-level voltage supply and ground. A charge-recycling circuit is coupled to the gate of the first switching transistor, the gate of the second switching transistor, the first mid-level voltage supply, and the second mid-level voltage supply to selectively recycle charge between the first mid-level voltage supply and the second mid-level voltage supply.

31 Claims, 4 Drawing Sheets

(56) References Cited

U.S. PATENT DOCUMENTS

| | | |
|---|---|---|
| 8,212,400 B2 | 7/2012 | Wu et al. |
| 2003/0075748 A1 | 4/2003 | Furuie et al. |
| 2007/0177412 A1 | 8/2007 | Sharp |
| 2013/0113446 A1 | 5/2013 | De Haas |
| 2013/0257176 A1 | 10/2013 | Crespi et al. |
| 2014/0021932 A1 | 1/2014 | Ejury |
| 2014/0042998 A1 | 2/2014 | Saito et al. |

OTHER PUBLICATIONS

Bayer E., et al., "Charge pump with Active Cycle regulation—closing the gap between linear and skip modes," IEEE 31st Annual Power Electronics Specialists Conference, 2000, vol. 3, pp. 1497-1502.

Mazumdar K., et al., "Exploration of Charge Recycling DC-DC Conversion Using a Switched Capacitor Regulator," Journal of Low Power Electronics and Applications, 2013, vol. 3 (3), pp. 250-266.

Rajapandian S., et al., "High-Voltage Power Delivery through Charge Recycling," IEEE Journal of Solid-State Circuits, Jun. 2006, vol. 41 (6), pp. 1400-1410.

Ueda K., et al., "Low-Power On-Chip Charge-Recycling DC-DC Conversion Circuit and System," IEEE Journal of Solid-State Circuits, Nov. 2013, vol. 48 (11), pp. 2608-2617.

Wen Y., et al., "Closed-loop control of gate-charge recycling in a 20 MHz dc-dc converter," 2010 IEEE 12th Workshop on Control and Modeling for Power Electronics (COMPEL), Jun. 2010, pp. 1-7.

International Search Report and Written Opinion—PCT/US2015/027387—ISA/EPO—Jul. 21, 2015.

\* cited by examiner

CHARGE-RECYCLING CIRCUITS INCLUDING SWITCHING POWER STAGES WITH FLOATING RAILS

RELATED APPLICATIONS

This application is related to U.S. patent application Ser. No. 14/260,592, filed on even date herewith, entitled "CHARGE-RECYCLING CIRCUITS" and U.S. patent application Ser. No. 14/260,658, filed on even date herewith, entitled "CHARGE PUMPS HAVING VARIABLE GAIN AND VARIABLE FREQUENCY," which are incorporated by reference herein in their entirety.

BACKGROUND

The disclosure relates to charge-recycling circuits, and in particular, to charge-recycling circuits including switching power stages with floating rails.

Unless otherwise indicated herein, the approaches described in this section are not admitted to be prior art by inclusion in this section.

Power stages are core blocks of switched-mode power supplies and are used to change the current and power flow during each phase of operation. The internal loss of a power stage is a critical design parameter of a power stage and should be minimized to improve the overall power conversion efficiency.

It is very common to use regulated mid-rails (auxiliary rails) to drive each power switch of the power stage to optimize the over-drive voltage (or gate-source voltage VGS) of switches. The mid-rails are often generated and regulated using low dropout regulators (LDOs). However, LDOs suffer from poor efficiency especially when the voltage drop across the pass device is high.

SUMMARY

The present disclosure describes charge-recycling circuits including switching power stages with floating rails.

In one embodiment, a circuit comprises a first switching transistor and a second switching transistor. The first switching transistor and the second switching transistor are coupled in series between an input voltage and ground and having a common node therebetween to provide a switching output. A first switching circuit selective couples a gate of the first switching transistor to the input voltage and a first mid-level voltage supply. A second switching circuit selectively couples a gate of the second switching transistor to a second mid-level voltage supply and ground. A charge-recycling circuit is coupled to the gate of the first switching transistor, the gate of the second switching transistor, the first mid-level voltage supply, and the second mid-level voltage supply to selectively recycle charge between the first mid-level voltage supply and the second mid-level voltage supply.

In one embodiment, the charge-recycling circuit includes a third switching circuit.

In one embodiment, the third switching circuit comprises a first switch selectively coupled between the gate of the first switching transistor and the second mid-level voltage supply to transfer charge from the gate of the first switching transistor to the second mid-level voltage supply before the first switching transistor is turned on. The first switch further comprises a second switch selectively coupled between the gate of the second switching transistor and the first mid-level voltage supply to transfer charge from the gate of the second switching transistor to the first mid-level voltage supply before the second switching transistor is turned on.

In one embodiment, the charge-recycling circuit includes a fourth switching circuit.

In one embodiment, the third switching circuit comprises a first switch selectively coupled between the gate of the first switching transistor and the second mid-level voltage supply to transfer charge from the gate of the first switching transistor to the second mid-level voltage supply before the first switching transistor is turned on. The fourth switching circuit comprises a second switch selectively coupled between the gate of the second switching transistor and the first mid-level voltage supply to transfer charge from the gate of the second switching transistor to the first mid-level voltage supply before the second switching transistor is turned on.

In one embodiment, the charge-recycling circuit includes a charge pump to store charge from the gate of the first switching transistor before the first switching transistor is turned on.

In one embodiment, the charge pump boosts the second mid-level voltage supply while the second switching transistor is turned on and while the first switching transistor is turned on.

In one embodiment, the charge-recycling circuit includes a charge pump that stores charge from the gate of the first switching transistor in a plurality of capacitors before the first switching transistor is turned on.

In one embodiment, the plurality of capacitors are configured in series between the first mid-level voltage and the voltage of the second mid-level voltage supply while the second switching transistor is turned on and while the first switching transistor is turned on.

In one embodiment, the first mid-level voltage supply has a voltage that is less than a voltage of the second mid-level voltage supply.

In one embodiment, a method comprises selectively coupling a gate of a first switching transistor to an input voltage and a first mid-level voltage supply; selectively coupling a gate of a second switching transistor to a first mid-level voltage supply and ground, the first switching transistor and the second switching transistor being coupled in series between the input voltage and ground and having a common node therebetween to provide a switching output; and selectively recycling charge between the gate of the first switching transistor, the gate of the second switching transistor, the first mid-level voltage supply, and the second mid-level voltage supply.

In one embodiment, the method further comprises selectively coupling the gate of the first switching transistor to the second mid-level voltage supply to transfer charge from the gate of the first switching transistor to the second mid-level voltage supply before the first switching transistor is turned on.

In one embodiment, the method further comprises selectively coupling the gate of the second switching transistor to the first mid-level voltage supply to transfer charge from the gate of the second switching transistor to the first mid-level voltage supply before the second switching transistor is turned on.

In one embodiment, the method further comprises storing charge from the gate of the first switching transistor before the first switching transistor is turned on.

In one embodiment, the method further comprises boosting the second mid-level voltage supply using the stored charge while the second switching transistor is turned on and while the first switching transistor is turned on.

In one embodiment, the method further comprises storing charge from the gate of the first switching transistor in a plurality of capacitors before the first switching transistor is turned on.

In one embodiment, the method further comprises coupling the capacitors in series between the first mid-level voltage and the voltage of the second mid-level voltage supply while the second switching transistor is turned on and while the first switching transistor is turned on.

In one embodiment, the method further comprises the first mid-level voltage supply having a voltage that is less than a voltage of the second mid-level voltage supply.

The following detailed description and accompanying drawings provide a better understanding of the nature and advantages of the present disclosure.

BRIEF DESCRIPTION OF THE DRAWINGS

With respect to the discussion to follow and in particular to the drawings, it is stressed that the particulars shown represent examples for purposes of illustrative discussion, and are presented in the cause of providing a description of principles and conceptual aspects of the present disclosure. In this regard, no attempt is made to show implementation details beyond what is needed for a fundamental understanding of the present disclosure. The discussion to follow, in conjunction with the drawings, make apparent to those of skill in the art how embodiments in accordance with the present disclosure may be practiced. In the accompanying drawings.

DETAILED DESCRIPTION

In the following description, for purposes of explanation, numerous examples and specific details are set forth in order to provide a thorough understanding of the present disclosure. It will be evident, however, to one skilled in the art that the present disclosure as expressed in the claims may include some or all of the features in these examples, alone or in combination with other features described below, and may further include modifications and equivalents of the features and concepts described herein.

Figure 1:
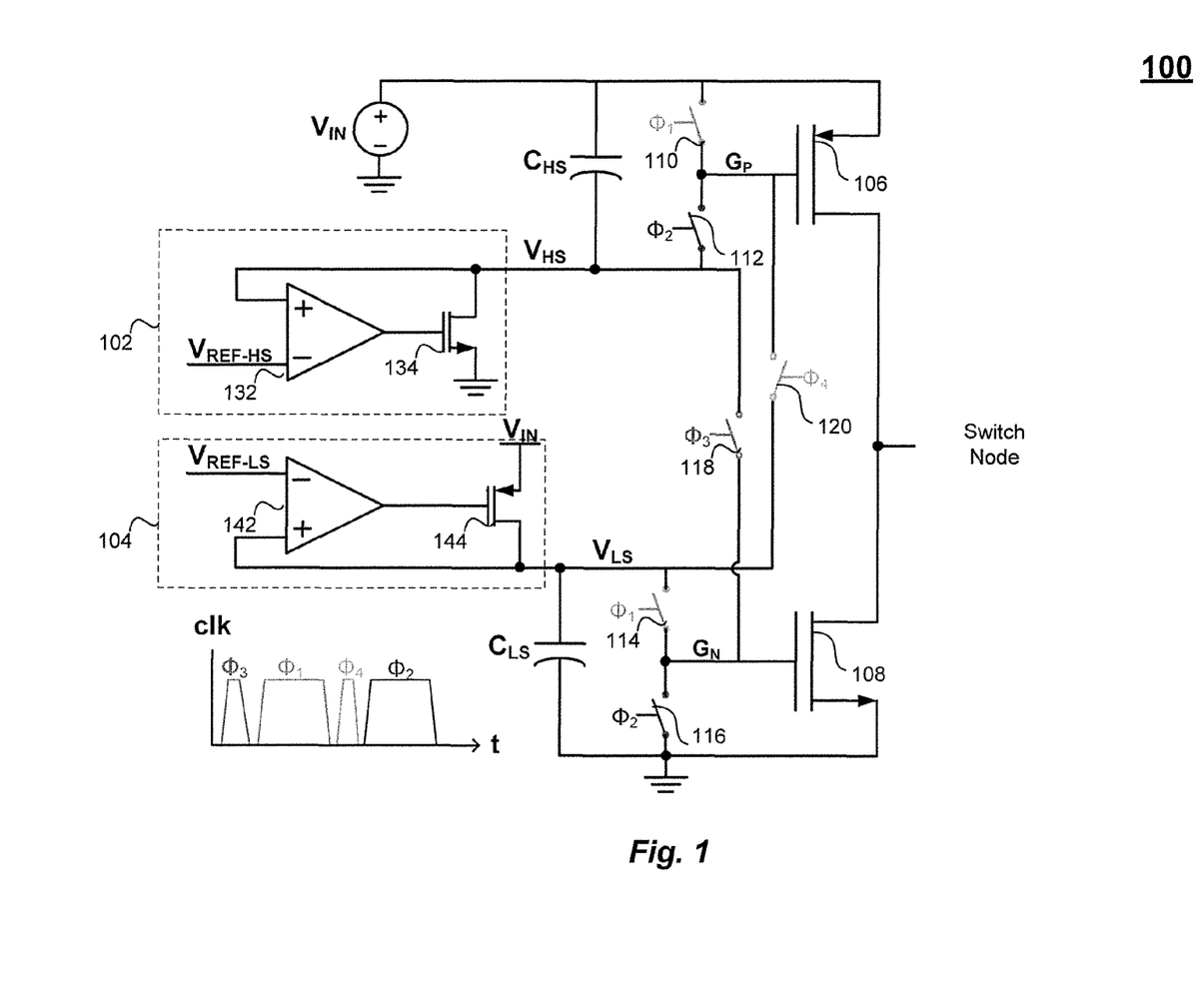
FIG. 1 is a block diagram illustrating a charge-recycling circuit according to an embodiment.

FIG. 1 is a block diagram illustrating a charge-recycling circuit 100 according to an embodiment. Charge-recycling circuit 100 comprises a plurality of low dropout regulators (LDOs) 102 and 104, a high side switching transistor 106, a low side switching transistor 108, and a plurality of switches 110, 112, 114, 116, 118, and 120.

Responsive to a supply voltage VDD, a voltage controlled oscillator (VCO) (not shown) or other clock generator generates a clock $\phi1$, a clock $\phi2$, a clock $\phi3$, and a clock $\phi4$ that, in this example, are non-overlapping clocks running at 100 MHz. As shown in FIG. 1, the clock $\phi3$ and the clock $\phi4$ have a shorter pulse width than the clock $\phi1$ and the clock $\phi2$. The clock $\phi1$ is used for control signals for switches 110 and 114. The clock $\phi2$ is used for control signals for switches 112 and 116. The clock $\phi3$ is used for control signals for switch 118. The clock $\phi4$ is used for control signals for switch 120.

High side switching transistor 106 and low side switching transistor 108 are coupled in series between an input voltage Vin and ground and form a switch driver for a switching regulator (not shown) such as a buck converter. A switch output node between the transistors 106 and 108 provides a switching output signal for controlling, for example, the switching regulator. LDO 102 generates a high side mid-voltage (VHS) in response to a high side reference voltage (VREF-HS). LDO 102 comprises an operational amplifier 132 and a pass transistor 134. LDO 104 generates a low side mid-voltage (VLS) in response to a low side reference voltage (VREF-LS). LDO 104 comprises an operational amplifier 142 and a pass transistor 144.

In this example, the high side mid-voltage (VHS) is between about 0.4-0.8 V and outputs charge to the low side mid-voltage (VLS) to maintain the low side mid-voltage (VLS) at close to 1.2 V. In this example, the input voltage Vin equals the power supply Vdd that may vary from 1.6-2 V.

Switches 110 and 112 coupled between the input voltage Vin and the high side mid-voltage (VHS) are switches in the high side switch. Switches 114 and 116 coupled between the low side mid-voltage (VLS) and ground are switches in the low side switch.

On the high side switch, switch 110 selectively couples the gate of high side switching transistor 106 and switch 112 to the input voltage Vin in response to a first control signal (e.g., being in an active state or on state) (clock $\phi1$). Switch 112 selectively couples the gate of high side switching transistor 106 to the output of LDO 102 in response to a second control signal (e.g., being in an active state or on state) (clock $\phi2$).

On the low side switch, switch 116 selectively couples the gate of low side switching transistor 108 to ground in response to the second control signal (e.g., being in an active state or on state) (clock $\phi2$). Switch 114 selectively couples the gate of low side switching transistor 108 to the output of LDO 104 in response to the first control signal (e.g., being in an active state or on state) (clock $\phi1$).

Switch 118 selectively couple the output of LDO 102 to the gate of low side switching transistor 108 in response to a third control signal (e.g., being in an active state or on state) (clock $\phi3$). Switch 120 selectively couples the output of LDO 104 to the gate of high side switching transistor 106 in response to a fourth control signal (e.g., being in an active state or on state) (clock $\phi4$).

As shown in FIG. 1, the clocks occur in the sequence: clock $\phi3$, clock $\phi1$, clock $\phi4$, and clock $\phi2$. Switch 118 closes and opens, before switches 110 and 114 open and close; switch 120 closes and opens before switches 112 and 116 close and open, and so forth. The non-overlapping of clocks provide "break before make" of closing and opening of corresponding switches.

Turning on the low side is done in two steps. The voltage on the gate of low side switching transistor 108 is first pulled up to the high side mid-voltage (VHS), which in this example is at 0.6V. Second, the voltage on the gate of low side switching transistor 108 is pulled up to the low side mid-voltage (VLS), which in this example is at 1.2 V. During clock $\phi3$ and clock $\phi1$, the low side is on. Clock $\phi3$ closes switch 118 to pull the gate of low side switching transistor 108 up to the high side mid-voltage (VHS) (e.g., 0.6 V) of the output of LDO 102. Clock $\phi1$ closes switch 114 to pull the gate of low side switching transistor 108 to the low side mid-voltage (VLS) (e.g., 1.2 V) to turn on low side switching transistor 108. Also clock $\phi1$ closes switch 110 to pull the gate of high side switching transistor 106 to the input voltage Vin to turn off high side switching transistor 106.

Turning on the high side is done in two steps. The voltage on the gate of high side switching transistor 106 is first pulled down from the input voltage Vin, which in this example is at 1.8 V, to the low side mid-voltage (VLS), which in this example is at 1.2 V. Second, the voltage on the gate of high side switching transistor 106 is pulled down to the high side mid-voltage (VHS), which in this example is at 0.6 V. During clock ϕ4 and clock ϕ2, the high side is on. Clock ϕ4 closes switch 120 to pull the gate of high side switching transistor 106 down to the low side mid-voltage (VLS)(e.g., 1.2 V) of the output of LDO 104, which in this example is at 1.2 V. Clock ϕ2 closes switch 112 to pull down the gate of high side switching transistor 106 to the high side mid-voltage (VHS) (e.g., 0.6 V) to turn on high side switching transistor 106. Also clock ϕ2 closes switch 116 to pull the gate of low side switching transistor 108 to ground to turn off low side switching transistor 108.

During clock ϕ3 and clock ϕ4, the charge and current that would have been dissipated in LDOs 102 and 104 is recycled. This reduces the power consumption of LDOs 102 and 104 and increases the overall efficiency of the power stage.

Charge-recycling circuit 100 couples current between LDO 102 and LDO 104. Maintaining an LDO output voltage may, at times, require additional current, which is typically provided through LDO 102 or 104 causing energy loss. In one embodiment, changes in current required by one of LDO 102 or 104 may be provided from the LDO 102 or 104 by switches 118 or 120 so that the current through one or both of LDOs 102, 104 is reduced, thereby reducing power loss. This is referred to as charge recycling.

Figure 2:
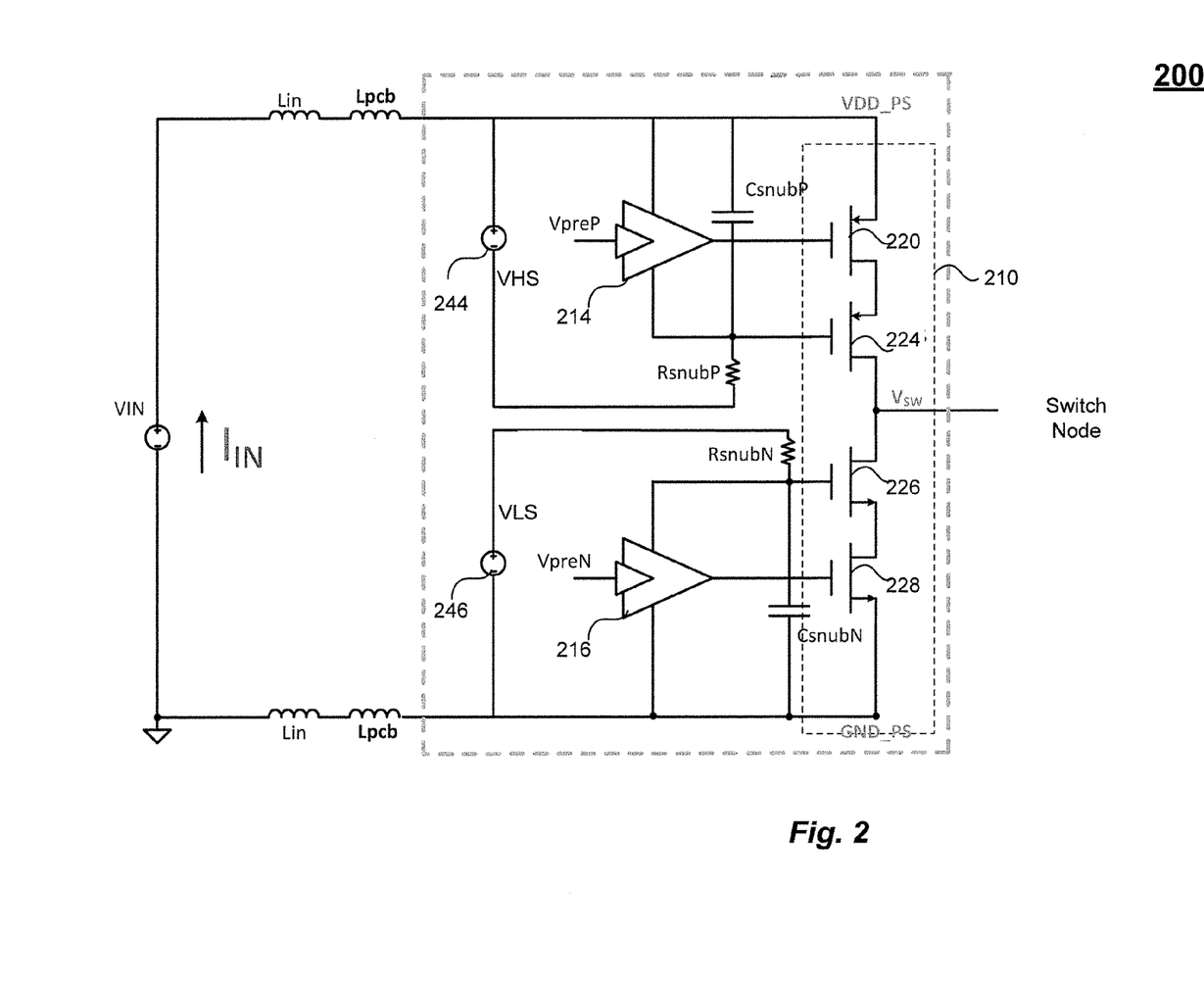
FIG. 2 is a block diagram illustrating a charge-recycling circuit according to another embodiment.

FIG. 2 is a block diagram illustrating a charge-recycling circuit 200 according to an embodiment. Charge-recycling circuit 200 comprises a switching driver 210, a high side buffer circuit 214, and a low side buffer circuit 216, a high side mid-voltage source 244, and a low side mid-voltage source 246.

Switching driver 210 comprises a high side switching power transistor 220, a low side switching power transistor 222, a high side cascode transistor 224, and a low side cascode transistor 226. Switching driver 210 can be a switching driver for a buck converter. Cascode transistors 224 and 226 are high side and low side cascode transistors, respectively, to reduce voltage drop across switching power transistors 220 and 222, respectively. High side mid-voltage source 244 and low side mid-voltage source 246 provide a high side mid-voltage (VHS) and a low side mid-voltage (VLS), respectively, as approximately constant gate drive voltages to cascode transistor 224 and cascode transistor 226, respectively. In this example, the low side mid-voltage (VLS) is greater than the high side mid-voltage (VHS). In one embodiment, high side mid-voltage source 244 can be LDO 102, and low side mid-voltage source 246 can be LDO 104. In this example, the load of high side mid-voltage source 244 is high side buffer circuit 214. Additionally, high side mid-voltage source 244 can be used as the low supply voltage for a high side driver that produces switching signals to high side switching power transistor 220. Accordingly, the high side driver is a load on high side mid-voltage source 244.

A similar arrangement is used for the low side. In this example, the load of low side mid-voltage source 246 is low side buffer circuit 216. Additionally, low side mid-voltage source 246 can be used as the low supply voltage for a low side driver that produces switching signals to low side switching power transistor 222. Accordingly, the low side driver is a load on low side mid-voltage source 246. Buffer circuits 214 and 216 receive pre-power stage voltages VpreP and VpreN, respectively, from pre-driver circuits (not shown) for driving the switching driver 210. Switches (not shown in FIG. 2 and described in conjunction with FIGS. 1 and 3) provide the coupling for charge recycling between high side switching power transistor 220 and low side switching power transistor 222.

Figure 3:
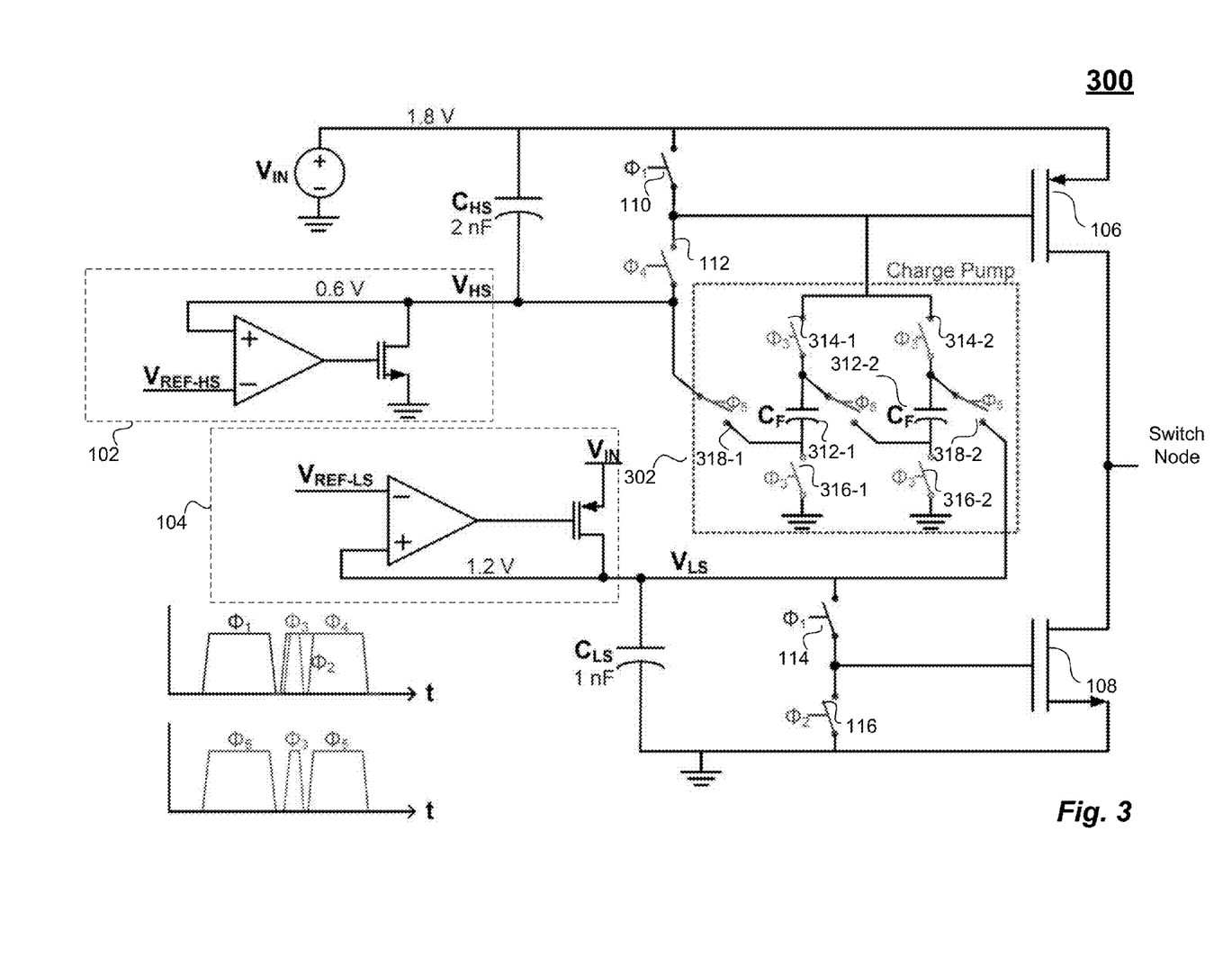
FIG. 3 is a block diagram illustrating a charge-recycling circuit according to yet another embodiment.

FIG. 3 is a detailed circuit illustrating a charge-recycling circuit 300 according to an embodiment. Charge-recycling circuit 300 comprises low dropout regulators (LDOs) 102 and 104, high side switching transistor 106, low side switching transistor 108, a plurality of switches 110, 112, 114, and 116, and a charge pump 302. Charge pump 302 comprises a plurality of capacitors 312-1 and 312-2 and a plurality of switches 312-1, 312-2, 314-1, 314-2, 316-1, 316-2, 318-1 and 312-2.

Charge-recycling circuit 300 can be used for switching driver 210 of FIG. 2. Charge-recycling circuit 300 is similar to charge-recycling circuit 100, which changes the bi-level gate signals on the power switch transistors 106 and 108 to tri-level signals. In some cases, the tri-level gate signals slow down the switching transition, and may not be suitable for some applications. Before switching on the high side, charge pump 302 couples the gate of high side switching transistor 106 to capacitors 312 to simultaneously discharge the gate to the high side mid-voltage (VHS) and charge the capacitors 312.

Switches 110 and 112 coupled between the input voltage Vin and the high side mid-voltage (VHS) are switches in the high side driver. Switches 114 and 116 coupled between the low side mid-voltage VLS and ground are switches in the low side driver.

As shown in FIG. 3, a clock ϕ1 controls the low side switching, and a clock ϕ2 controls the low side driver during the high side switching. A clock ϕ3 controls a discharge of the high side driver. A clock ϕ4 controls the high side switching. During the charge recycling to the low side driver, a clock ϕ5 and the clock ϕ3 control charge pump 302 for the charge transfer. The clock ϕ1, the clock ϕ2, the clock ϕ3, the clock ϕ4, and the clock ϕ5 are used for timing of charge pump 302 and control signals for switches 110, 112, 114, and 116.

On the high side driver, switch 110 selectively couples the gate of high side switching power transistor 106 and switch 112 to the input voltage Vin in response to a first control signal (e.g., being in an active state or on state)(clock ϕ1). Switch 112 selectively couples the gate of high side switching power transistor 106 to the output of LDO 102 in response to a fourth control signal (e.g., being in an active state or on state) (clock ϕ4).

On the low side driver, switch 116 selectively couples the gate of low side switching power transistor 108 to ground in response to the second control signal (e.g., being in an active state or on state) (clock ϕ2). Switch 114 selectively couples the gate of low side switching power transistor 108 to the output of LDO 104 in response to the first control signal (e.g., being in an active state or on state) (clock ϕ1).

During clock ϕ1, the low side is on and the high side is off. Clock ϕ1 closes switch 110 to pull the gate of high side switching power transistor 106 to the input voltage Vin to turn off high side switching power transistor 106 and pull the gate of low side switching power transistor 108 to the low side mid-voltage (VLS) to turn on low side switching power transistor 108.

During clock ϕ2, the high side is on and the low side is off. Clock ϕ2 closes switch 116 to pull the gate of low side switching power transistor 108 to ground to turn off low side switching power transistor 108. As noted above, before turning on the high side with clock ϕ4, clock ϕ3 is provided to charge pump 302 to discharge the gate of high side switching power transistor 106. Switches 314-1 and 314-2 selectively couple capacitors 312-1 through 312-2, respectively, to the gate of high side switching power transistor 106 to discharge the gate to the capacitors 312 in response to corresponding control signals (clock φ3). Switches 316-1 and 316-2 selectively couple capacitors 312-1 through 312-2, respectively, to ground in response to corresponding control signals (clock φ3) during charging of capacitors 312. Clock φ3 opens switches 314 and 316. Clock φ4 closes switch 112 to pull the gate of high side switching power transistor 106 to the high side mid-voltage (VHS) to turn on high side switching power transistor 106 for the duration of clock φ2.

During clock φ1 when the low side is on, charge recycling is provided to the low side driver with clock φ5 controlling charge pump 302 for the charge transfer. The clock φ5 closes the switches 318 to couple the output of LDO 102 to the output of LDO 104 to transfer the charge from capacitors 312 to the low-side rail (low side mid-voltage (VLS)). Clock φ1 and clock φ5 overlap on the low side.

During clock φ2 when the high side is on, as described above, the clock φ3 discharges the charge on the gate of high side switching power transistor 106 into capacitors 312. The clock φ5 closes the switches 318 to couple the output of LDO 102 to the output of LDO 104 to transfer the charge from capacitors 312 to the low-side rail (low side mid-voltage (VLS)). Clock φ4 and clock φ5 overlap on the high side.

In various embodiments, a switchable capacitor circuit can be coupled between the gate of the low side switching transistor 108 and ground to provide charge-recycling from the gate of the high side mid-voltage (VHS) in a similar manner during the low side switching.

The switches described herein can be implemented as one or more transistors. A controller or state machine (not shown) can control the switches described herein.

The outputs of the charge-recycling circuits 100, 200, 300 can be coupled to switching regulators.

Figure 4:
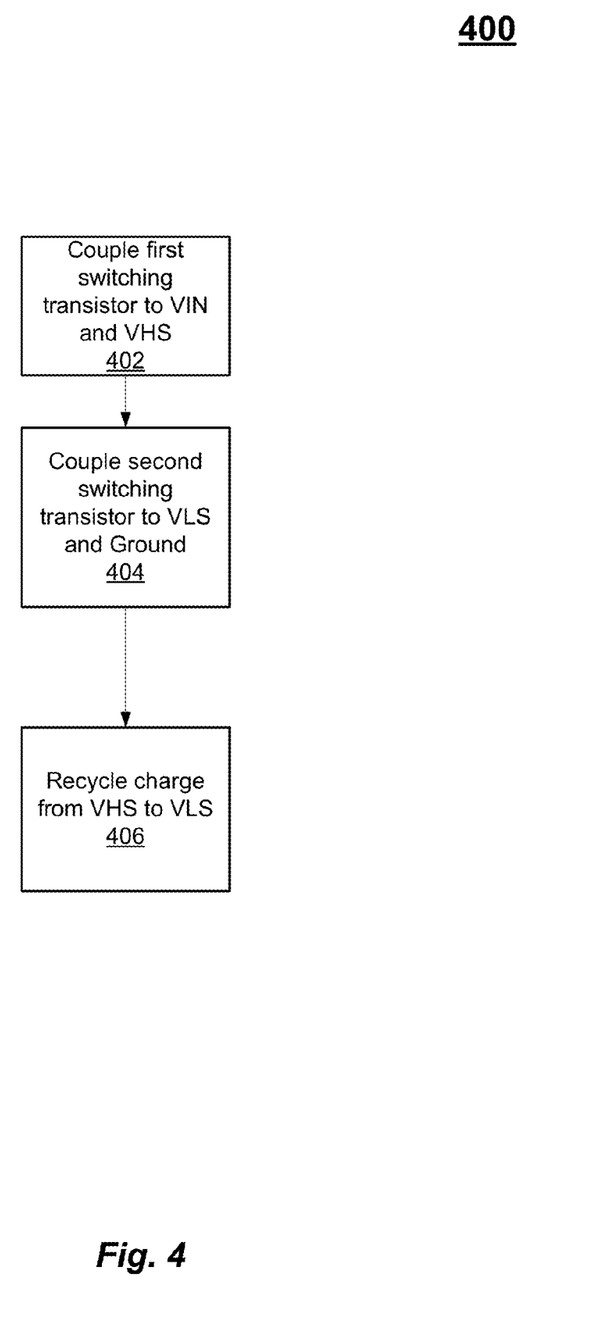
FIG. 4 illustrates a simplified diagram illustrating a process flow for recycling current according to an embodiment.

FIG. 4 illustrates a simplified diagram illustrating a process flow 400 for recycling current according to an embodiment. At 402, a gate of high side switching power transistor 106 is selectively coupled via switch 110 to input voltage VIN and selectively coupled via switch 112 to the high side mid-level voltage supply (VHS) by non-overlapping clocks. At 404, a gate of low side switching power transistor 108 is selectively coupled via switch 114 to low side mid-level voltage supply (VLS) and is selectively coupled via switch 116 to ground by non-overlapping clocks. At 406, charge is selectively recycled between the gate of high side switching power transistor 106, the gate of the low side switching power transistor 108, the high side mid-level voltage supply (VHS), and the low side mid-level voltage supply (VLS).

The above description illustrates various embodiments of the present disclosure along with examples of how aspects of the particular embodiments may be implemented. The above examples should not be deemed to be the only embodiments, and are presented to illustrate the flexibility and advantages of the particular embodiments as defined by the following claims. Based on the above disclosure and the following claims, other arrangements, embodiments, implementations and equivalents may be employed without departing from the scope of the present disclosure as defined by the claims.

What is claimed is:

1. A circuit comprising:
   a first switching transistor;
   a second switching transistor, the first switching transistor and the second switching transistor coupled in series between an input voltage and ground and having a common node therebetween to provide a switching output;
   a first switching circuit to selectively couple a gate of the first switching transistor to the input voltage and a first mid-level voltage supply;
   a second switching circuit to selectively couple a gate of the second switching transistor to a second mid-level voltage supply and ground; and
   a charge-recycling circuit coupled to the gate of the first switching transistor, the gate of the second switching transistor, the first mid-level voltage supply, and the second mid-level voltage supply to selectively recycle charge between the first mid-level voltage supply and the second mid-level voltage supply.

2. The circuit of claim 1 wherein the charge-recycling circuit comprises:
   a first switch to selectively couple the gate of the first switching transistor and the second mid-level voltage supply; and
   a second switch to selectively couple the gate of the second switching transistor and the first mid-level voltage supply.

3. The circuit of claim 1 wherein the first switching circuit comprises:
   a first switch coupled between the gate of the first switching transistor and the input voltage; and
   a second switch coupled between the gate of the first switching transistor and the first mid-level voltage supply.

4. The circuit of claim 1 wherein the second switching circuit comprises:
   a first switch coupled between the gate of the second switching transistor and ground; and
   a second switch coupled between the gate of the second switching transistor and the second mid-level voltage supply.

5. The circuit of claim 1 wherein,
   during a first time period, the gate of the first switching transistor is coupled to the input voltage and the gate of the second switching transistor is coupled to the second mid-level voltage supply,
   during a second time period following the first time period, the gate of the first switching transistor is coupled to the second mid-level voltage supply,
   during a third time period following the second time period, the gate of the first switching transistor is coupled to the first mid-level voltage supply and the gate of the second switching transistor is coupled to ground; and
   during a fourth time period following the third time period, the gate of the second switching transistor is coupled to the first mid-level voltage supply, and
   wherein the first mid-level voltage supply is less than the second mid-level voltage supply, and wherein the first time period follows the fourth time period.

6. The circuit of claim 1 wherein turning on the first switching transistor comprises coupling the gate of the first switching transistor to a plurality of voltages over a corresponding plurality of time periods.

7. The circuit of claim 1 wherein turning on the second switching transistor comprises coupling the gate of the second switching transistor to a plurality of voltages over a corresponding plurality of time periods.

8. The circuit of claim 1 wherein the first mid-level voltage supply has a voltage that is less than a voltage of the second mid-level voltage supply.

9. A method comprising:
   selectively coupling a gate of a first switching transistor to an input voltage and a first mid-level voltage supply;

selectively coupling a gate of a second switching transistor to a second mid-level voltage supply and ground, the first switching transistor and the second switching transistor being coupled in series between the input voltage and ground and having a common node therebetween to provide a switching output; and selectively recycling charge between the gate of the first switching transistor, the gate of the second switching transistor, the first mid-level voltage supply, and the second mid-level voltage supply.

10. The method of claim 9 further comprising selectively coupling the gate of the first switching transistor to the second mid-level voltage supply.

11. The method of claim 10 further comprising selectively coupling the gate of the second switching transistor to the first mid-level voltage supply.

12. The method of claim 9 wherein during a first time period, the gate of the first switching transistor is coupled to the input voltage and the gate of the second switching transistor is coupled to the second mid-level voltage supply, during a second time period following the first time period, the gate of the first switching transistor is coupled to the second mid-level voltage supply, during a third time period following the second time period, the gate of the first switching transistor is coupled to the first mid-level voltage supply and the gate of the second switching transistor is coupled to ground; and during a fourth time period following the third time period, the gate of the second switching transistor is coupled to the first mid-level voltage supply, and wherein the first mid-level voltage supply is less than the second mid-level voltage supply, and wherein the first time period follows the fourth time period.

13. The method of claim 9 wherein turning on the first switching transistor comprises coupling the gate of the first switching transistor to a plurality of voltages over a corresponding plurality of time periods.

14. The method of claim 9 wherein turning on the second switching transistor comprises coupling the gate of the first switching transistor to a plurality of voltages over a corresponding plurality of time periods.

15. The method of claim 9 wherein the first mid-level voltage supply has a voltage that is less than a voltage of the second mid-level voltage supply.

16. A circuit comprising:
a first switching transistor;
a second switching transistor, the first switching transistor and the second switching transistor configured in series between an input voltage terminal and a reference voltage terminal and forming a switching node therebetween;
a first voltage source, wherein a gate of the first switching transistor is selectively coupled between the input voltage terminal and the first voltage source;
a second voltage source, wherein a gate of the second switching transistor is selectively coupled between the second voltage source and the reference voltage terminal; and
a charge-recycling circuit coupled between the first voltage source and the second voltage source and comprising a plurality of switches configured to recycle charge between the gate of the first switching transistor and the gate of the second switching transistor.

17. The circuit of claim 16 wherein the reference voltage terminal is coupled to ground, and wherein a first voltage on the first voltage source is less than a second voltage on the second voltage source.

18. The circuit of claim 16 wherein the first voltage source is a first low dropout regulator and the second voltage source is a second low dropout regulator.

19. The circuit of claim 16 further comprising:
a first switch coupled between the gate of the first switching transistor and the input voltage terminal;
a second switch coupled between the gate of the first switching transistor and the first voltage source;
a third switch coupled between the gate of the second switching transistor and the reference voltage terminal; and
a fourth switch coupled between the gate of the second switching transistor and the second voltage source,
wherein the charge recycling circuit comprises:
a fifth switch coupled between the gate of the first switching transistor and the second voltage source; and
a sixth switch coupled between the gate of the second switching transistor and the first voltage source.

20. The circuit of claim 16, the charge recycling circuit further comprising a plurality of capacitors, wherein the plurality of switches and the plurality of capacitors are configured as a charge pump.

21. The circuit of claim 20, the charge pump comprising:
a first input coupled to the first voltage source;
a second input coupled to the gate of the first switching transistor; and
an output coupled to the second voltage source.

22. The circuit of claim 20, wherein during a first time period, the plurality of capacitors store charge from the gate of the first switching transistor, and during a second time period, the plurality of capacitors are configured to generate a boost voltage from the first voltage source and the second voltage source.

23. The circuit of claim 20, wherein
during a first time period, the first switching transistor is turned off and the second switching transistor is turned on; and
during a second time period, the first switching transistor is turned on and the second switching transistor is turned off,
wherein, during a first portion of the second time period, the plurality of switches and the plurality of capacitors are configured to store charge from the gate of the first switching transistor, and during a second portion of the second time period, the plurality of switches and the plurality of capacitors are configured to transfer charge to the second voltage source.

24. The circuit of claim 23, wherein during the first portion of the second time period, the plurality of capacitors are coupled to the gate of the first switching transistor and configured in parallel, and during the second portion of the second time period, the plurality of capacitors are configured in series between the first voltage source and the second voltage source.

25. The circuit of claim 16 further comprising:
a first switch coupled between the gate of the first switching transistor and the input voltage terminal;
a second switch coupled between the gate of the first switching transistor and the first voltage source;
a third switch coupled between the gate of the second switching transistor and the second voltage source; and
a fourth switch coupled between the gate of the second switching transistor and the reference voltage terminal.

26. The circuit of claim 16, the charge recycling circuit further comprising a plurality of capacitors, wherein
- a first switch of the plurality of switches is coupled between a first terminal of a first capacitor of the plurality of capacitors and the first voltage source,
- a second switch of the plurality of switches is coupled between a second terminal of a second capacitor of the plurality of capacitors and the second voltage source,
- a plurality of first switches couple a plurality of first terminals, including the first terminal of the first capacitor, to the reference voltage terminal, and a plurality of second switches couple a plurality of second terminals, including the second terminal of the second capacitor, to the gate of the first switching transistor to selectively configure the capacitors in parallel, and
- one or more switches are configured between second terminals of one capacitor and first terminals of another capacitor to selectively configure the capacitors in series.

27. The circuit of claim 16 further comprising:
- a first cascode transistor having a gate coupled to the first voltage source, the first cascode transistor configured between the first switching transistor and the switching node; and
- a second cascode transistor having a gate coupled to the second voltage source, the second cascode transistor configured between the second switching transistor and the switching node.

28. The circuit of claim 16 wherein the circuit is configured in a switching regulator.

29. A circuit comprising:
- first switching transistor means for coupling an input voltage to a switching node;
- second switching transistor means for coupling the switching node to a reference voltage, wherein the first switching transistor means and the second switching transistor means provide a switching output;
- means for generating a first voltage;
- means for generating a second voltage, wherein the second voltage is greater than the first voltage;
- means for selectively coupling a gate of the first switching transistor means between the input voltage and the first voltage;
- means for selectively coupling a gate of the second switching transistor means between the second voltage and the reference voltage; and
- means for recycling charge between the first voltage and the second voltage, wherein the mean for recycling charge is coupled between the gate of the first switching transistor means and the gate of the second switching transistor means.

30. The circuit of claim 29, the means for recycling charge comprising means for coupling the gate of the first switching transistor means to the second voltage and means for coupling the gate of the second switching transistor means to the first voltage.

31. The circuit of claim 29, the means for recycling charge comprising means for storing charge from the gate of the first switching transistor means during a first time period and means for transferring charge to the means for generating the second voltage during a second time period following the first time period.

* * * * *